United States Patent [19]
Chen et al.

[11] Patent Number: 6,136,651
[45] Date of Patent: Oct. 24, 2000

[54] METHOD OF MAKING SELF-ALIGNED FLASH MEMORY CELL TO PREVENT SOURCE LINE FROM TRENCH BY FIELD OXIDE BIRD BEAK PUNCH-THROUGH

[75] Inventors: Bin-Shing Chen; Chi-Hung Chao, both of Hsinchu, Taiwan

[73] Assignee: Winbond Electronics Corp., Hsinchu, Taiwan

[21] Appl. No.: 09/431,683

[22] Filed: Nov. 1, 1999

[51] Int. Cl.[7] .................................................. H01L 21/336
[52] U.S. Cl. ...................... 438/257; 438/294; 438/297; 438/211; 438/259; 438/264
[58] Field of Search .................................. 438/257, 297, 438/294, 211, 259, 264

[56] References Cited

U.S. PATENT DOCUMENTS

| | | | |
|---|---|---|---|
| 4,114,255 | 9/1978 | Salsbury et al. | 29/571 |
| 5,372,963 | 12/1994 | Mori | 437/48 |
| 5,432,109 | 7/1995 | Yamada | 437/43 |
| 5,950,085 | 9/1999 | Kojima et al. | 438/257 |
| 5,950,086 | 9/1999 | Takahashi et al. | 438/258 |
| 5,976,927 | 11/1999 | Hsich et al. | 438/239 |
| 5,998,262 | 12/1999 | Chen | 438/257 |

*Primary Examiner*—David Hardy
*Assistant Examiner*—N. Drew Richards
*Attorney, Agent, or Firm*—W. Wayne Liauh

[57] ABSTRACT

A process for making stacked gate memory cells which does not require the extra thermal cycle as in the conventional SAMOS process. It includes the steps of: (a) forming a silicon nitride layer on a wafer surface; (b) forming a diffusion pattern mask on the silicon nitride layer which includes a source line diffusion mask; (c) removing portions of the silicon nitride layer not covered by the diffusion pattern mask to expose a portion of the silicon substrate; (d) removing the diffusion pattern mask; (e) using the remaining portion of the silicon nitride as a mask to grow a field oxide layer in the silicon substrate; (f) forming a poly-1 layer, an interpoly dielectric layer, and a poly-2 layer on the wafer surface; (f) forming a SAMOS (self-aligned MOS) mask which contains a plurality of SAMOS strips perpendicular to the poly-1 strips, followed by SAMOS etching to form a plurality of stacked gates. The source diffusion mask is formed to have such a predetermined width that the field oxide layer is formed to contain bird beaks which merge with each other to form an interconnected field oxide bird's beak. Further, the interconnected field oxide bird's beak is formed to be thicker than the thickness of the interpoly dielectric layer so as to protect the portion of the silicon substrate not covered by the poly-1 strips from being trenched during the SAMOS etching process.

4 Claims, 4 Drawing Sheets

METHOD OF MAKING SELF-ALIGNED FLASH MEMORY CELL TO PREVENT SOURCE LINE FROM TRENCH BY FIELD OXIDE BIRD BEAK PUNCH-THROUGH

FIELD OF THE INVENTION

The present invention relates to an improved method for making self-aligned flash memory cells. More specifically, the present invention relates to an improved method for making self-aligned stacked gate memory cells which eliminates the need for an extra thermal oxidation cycle as required in one prior art process, as well as the large source voltage drop problem experienced in another prior art process. The method disclosed in the present invention also allows a more efficient scaling-down of the memory cell size than the prior art processes without incurring large expenses in capital investment.

BACKGROUND OF THE INVENTION

Flash EPROM devices or other flash memory cells have become very common consumer items. As it is true with many other consumer electronic components, there is a very high pressure that is imposed on flash memory manufacturers to constantly develop methods that can increase the semiconductor device density, enhance the performance of semiconductor devices, and fabricate them in a more cost-effective manner. One of the typical ways to increase the density of memory cells is through the use various types of self-aligned source etch (SAS) process.

In the so-called SAMOS (self-aligned MOS) process to form stacked-gate non-volatile memory by self-aligned etching, the floating gate is patterned using a two-step process. First, the poly-1 layer is defined (i.e., formed by etching) using a poly-1 photolithography process as comprising a plurality of parallel strips perpendicular to the direction of the control gates (CG) to be eventually formed. After the depositions of an interpoly dielectric layer and the poly-2 layer, respectively, a SAMOS mask, which coincides with the control gates, is defined with a photoresist. Thereafter, the poly-2 layer, the interpoly dielectric layer, and the poly-1 layer are etched, step by step, under the same SAMOS mask so that poly-1 layer is self-aligned to the upper poly-2 layer. However, since some of the poly-1 layer has been etched during the first poly-1 etching, the portion of the Si substrate between field oxide (FOX) regions will be trenched during the SAMOS etching.

One of the solutions to alleviate this problem is to implement a heavy N+ implantation after the poly-1 patterning, followed by a thermal oxidation process. This allows the trench region between the poly-1 strips and the field oxide regions to grow a thicker oxide because of the heavy doping enhanced oxidation. By doing so, the buried N+ (BN) oxide cause the Si substrate to be protected from trenching during the poly-1 removal as part of the SAMOS etching. However, this approach requires an extra thermal cycle. On the other hand, the heavy doping also enhances the oxidation along the poly-1 sidewall, this makes the subsequent SAMOS etching more difficult. Furthermore, this technique also requires a relatively wide source diffusion line to prevent the bird's beak from punch-through, as well as a relatively wide diffusion line from the control gate spacing to provide adequate field oxide rounding and misalignment margin. Both cause the cell size to increase.

Another solution is the so-called self-aligned source (SAS) process. With the SAS process, the field oxide is first formed as parallel strips. By doing so, the portion of the field oxide which crosses the sour line will protect against substrate trenching during the SAMOS etching. After the SAMOS etching, an SAS etching is implemented to remove the field oxide that crosses the source line, followed by the formation of source line connections in the diffusion layer. This approach eliminates the need for a rule of source diffusion line to the control gate spacing, thus, allowing the cell size to be reduced somewhat. However, there is also another problem that can be experienced with the SAS approach, in that the source line resistance can be substantially increased due to the significant variations in the device topography. This can cause large drops in the source voltage during cell operations. Furthermore, because the junction depth should be simultaneously scaled down when the cell size is scaled down, this causes the source resistance to increase significantly, especially for the fully-recessed LOCOS isolation. Thus, this approach also restricts the extent by which the isolation can be scaled down.

Many prior art patents provide good discussions on the self aligned source etch process. They are briefly described below to provide further background information.

U.S. Pat. Nos. 5,103,274 and 5,120,671 disclose a method and apparatus for self-aligning a source region with a field oxide region and a polysilicon gate and word line in a semiconductor device, such as EPROM, EEPROM, or other types of memory cells. The method and apparatus allows reduced memory cell size and improved device density by substantially eliminating the bird's beak encroachment and corner rounding effects typically found between neighboring cells due to inadequacies in the photolithography process.

U.S. Pat. No. 5,661,057 discloses a method for making flash memory which comprises the step of removing field insulation films by an etching process using side walls provided adjacent to the portions of the stacked gate which includes a floating gate electrode, a control gate electrode, and an inter-gate insulation film, as part of the mask for the etching. This method prevents damages that may be occurred to the portion of the gate insulation film situated between part of the floating gate electrode and the impurity diffused source electrode formed in the substrate.

U.S. Pat. No. 5,736,442 discloses a method of manufacturing a semiconductor memory device, before an exposed portion of the element separating the isolation film is subjected to etching according to the SAS technique. In this method, an isolation film is laminated to the entirety of the stacked gate, and thereafter, the exposed portion of the element separating isolation film is removed by etching while protecting the side surface of the floating gate with the isolation film.

U.S. Pat. Nos. 5,470,773, 5,517,443, 5,534,455 disclose a method for protecting the stacked gate edge of a semiconductor device which provides a spacer formation before the self aligned source (SAS) etch is accomplished. By providing the spacer formation prior to the SAS etch, tunnel oxide integrity can be improved and the source junction oxide integrity is made more uniform because the silicon around the source region is not gauged away.

U.S. Pat. No. 5,552,331 discloses a method in which spacers are formed along the stacked gates of a first type semiconductor device to protect the gate edge and adjacent source area during the self-aligned source etch. Spacers of different width are formed along the gates of a second type semiconductor device of the same integrated circuit which may be optimized for different voltage requirements. The purpose of the '331 patent is to decouple the memory cell requirement from the periphery device requirement, so that high gate spacing and smaller size can be achieved.

SUMMARY OF THE INVENTION

The primary object of the present invention is to develop an improved process for fabricating stacked gate memory cells. More specifically, the primary object of the present invention is to develop an improved SAMOS (self-aligned MOS) etching process which does not require the extra thermal oxidation cycle as required in most prior art self-aligned source (SAS) etching processes while providing improved performance.

In the process disclosed in the present invention, the width of the action region (i.e., the spacing between FOX) is intentionally made to be narrow enough that the bird's beaks of neighboring field oxide regions mutually punch through and connect to each other. However, such width shouldn't be too narrow so as to cause high voltage drop in the source line. The extent of the "mutual punching through" is also controlled such that the minimum thickness of the bird's beak is greater than the interpoly dielectric. The high poly/oxide selectivity during the SAMOS ensures that the Si substrate will not be trenched when the portion of poly-1 layer is being removed. Compared to the conventional SAMOS process, because the process of the present invention does not require the extra step BN oxidation, it benefits from the reduction of one thermal oxidation cycle. Furthermore, because there is no need to keep the relatively wide source diffusion line, the present invention allows better scaling of the cell size compared to the conventional BN oxidation approach. In fact, a sub-minimum source diffusion width rule can be used to force the bird's beaks to punch through. This further allows the cell size to be reduced.

Compared to the prior art SAS process, which, as discussed above, utilizes a uniform FOX thickness, because the thickness of the punching bird's beaks is much thinner than that of the field oxide, the source line resistance is much smaller than that by the SAS process. The punching bird's beaks can be removed by the SAS type etching, but no extra mask is needed compared to the conventional SAS process.

The process disclosed in the present invention first involves the step of well formations in a silicon substrate wafer. The silicon substrate wafer is oxidized in a furnace to grow a thin layer of silicon dioxide (SiO2) on the surface. This first silicon dioxide layer is known as the "pad" oxide. Then silicon nitride is deposited on the oxidized wafer in a gas phase chemical reactor. A diffusion pattern mask is then placed on the silicon nitride layer to protect and define the areas where the active regions of the device will be formed. The exposed regions of the nitride are etched away, using the diffusion pattern mask, to expose portions of the underlying pad oxide. The exposed pad oxide regions are then also etched away thus exposing the silicon substrate except, again, where the active regions of the device will be formed.

The patterned and etched wafer is implanted with additional boron atoms accelerated at high energy. The boron atoms will only reach the silicon substrate where the nitride and oxide has been etched away, providing areas that are doped strongly p-type that will electrically separate active areas. After implanting, the wafers are oxidized again to grow a thick oxide layer, which is commonly known as the "field oxide," or FOX. The field oxide only grows in the etched areas due to silicon nitride's properties as an oxidation barrier. When the field oxide is grown, some of the silicon substrate is consumed and the silicon nitride is lifted slightly at the edges creating a bird's beak formation. The remaining silicon nitride layer is then removed. As it has been discussed above, one of the key elements of the present invention is that the field oxide regions are patterned, i.e., the silicon nitride is etched, such that the bird's beaks from adjacent field oxide will "punch" through and connect with each other, and that the thickness of the "punching through" bird's beak will be greater than the interpoly dielectric layer to be subsequently formed, so as to protect the source line from being trenched during the removal of the portion of the poly-1 layer in the SAMOS etching step.

After the above steps, which allow the active regions to be defined and isolated, the semiconductor device threshold voltage is adjusted by implanting p-type dopant atoms, following by the growing of the gate tunnel oxide in a high temperature furnace. Then the wafer is deposited with a first layer of polysilicon or floating gate material. This is typically a poly-crystalline silicon ("poly-1 layer," or floating gate layer) which is deposited in a gas phase chemical reactor similar to that used for silicon nitride. A poly-1 mask is then laid on top of the poly-1 layer, which is then etched. Next, an interpoly oxide is formed on top of the floating gate layer, followed by the deposition of a second polysilicon layer, ("poly-2" layer or control gate layer) with a mask pattern laid on top to define the gates of the cell device. The second polysilicon layer, then the interpoly oxide, and lastly, the first polysilicon layer are etched in sequence, thus creating the stacked gate formation of a flash memory device.

After the stacked gates are formed, the wafer is subjected to a first source/drain implantation, which is typically provided to reduce the unwanted band-band current. Thereafter, a SAS mask is placed on top of the device to open the source region. Then a high selectivity etching is applied to remove the bird's beak of the field oxide layer, followed by source implantation. Cell drains are formed by first spacer TEOS deposition, followed by TEOS spacer etch, and second cell source/drain implantation.

Most of the individual steps described above are well known in the art. It, however, should be kept in mind that one of the key elements of the process disclosed in the present invention is to create and utilize the interconnected bird beaks that are mutually punching through from two neighboring field oxide regions so as to eliminate the extra thermal oxidation cycle required in the prior art process, while the punching-through bird's peaks are controlled so as to minimize the source line resistence as well as allowing further scaling down of the memory cell size.

BRIEF DESCRIPTION OF THE DRAWING

The present invention will be described in detail with reference to the drawing showing the preferred embodiment of the present invention, wherein.

DETAILED DESCRIPTION OF THE PREFERRED EMBODIMENT

The present invention discloses an improved SAMOS (self-aligned MOS) etch process for the fabrication of stacked gate memory cells which does not require the extra thermal oxidation cycle as required in most prior art SAMOS etch processes. One of the key elements of the process disclosed in the present invention is to control the width of the action region (i.e., the spacing between FOX) to a predetermined width which is narrow enough such that the bird's beaks of neighboring field oxide regions mutually punch through and are connected to each other. The extent of the "mutually punching through" of the bird peaks is controlled such that the minimum thickness of the bird's beak is greater than the interpoly dielectric. By properly selecting a high poly/oxide selectivity during the SAMOS etching, the process of the present invention prevents the Si substrate from being trenched when the portion of poly-1 layer is being removed during the SAMOS etch process. Compared to the conventional SAMOS process, because the process of the present invention does not require the extra step BN oxidation, it benefits from the elimination of one thermal oxidation cycle. Furthermore, because there is no need to keep the relatively wide source diffusion line, the present invention allows better scaling of the cell size compared to the conventional BN oxidation approach. In fact, a sub-minimum source diffusion width, or distance, can be used to force the bird's beaks to punch through. This further allows the cell size to be reduced.

The process of the present invention also provides advantages over the prior art SAS process, which, as discussed above, utilizes a uniform FOX thickness. Because the thickness of the punching bird's beaks, though it must be thicker than the thickness of interpoly dielectric, is still much thinner than that of the field oxide, thus the source line resistance is much smaller than that fabricated by the SAS process. The punching bird's beaks generated in the process of the present invention can be removed by the SAS type etching, but no extra mask is needed compared to the conventional SAS process.

Figure 1:
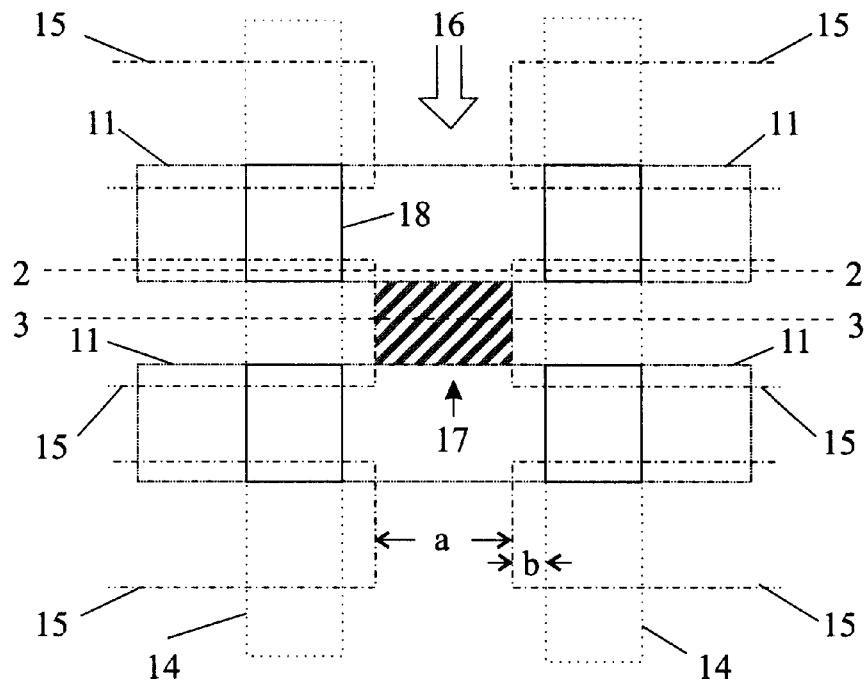
FIG. 1 is an illustrative schematic plan view of a prior art stacked gate memory cell fabricated according to the SAMOS process.
Figure 2:
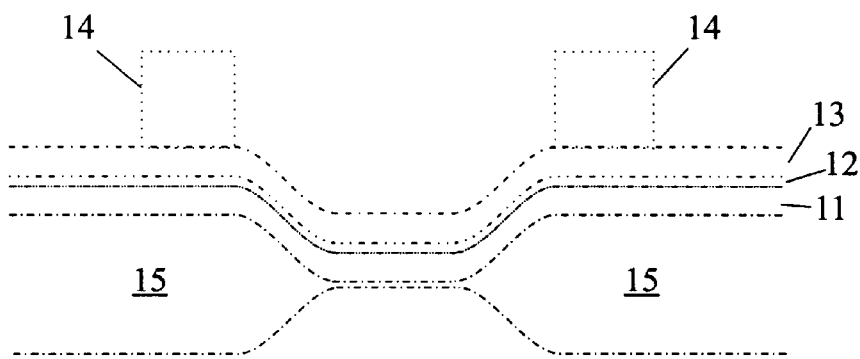
FIG. 2 is an illustrative schematic cross-sectional view of the prior art stacked gate memory cell as shown in FIG. 1 across line 2—2 prior to SAMOS etching.

Now referring to the drawings. FIG. 1 is an illustrative schematic plan view of a prior art stacked gate memory cell fabricated according to a conventional SAMOS process. FIG. 2 is an illustrative schematic cross-sectional view of the prior art stacked gate memory cell as shown in FIG. 1 across line 2—2 prior to SAMOS etching. And FIG. 3 is an illustrative schematic cross-sectional view of the prior art stacked gate memory cell as shown in FIG. 1 across line 3—3 prior to SAMOS etching.

Figure 3:
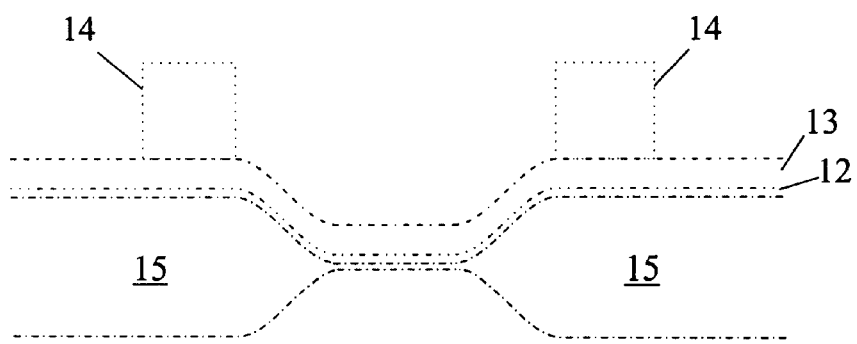
FIG. 3 is an illustrative schematic cross-sectional view of the prior art stacked gate memory cell as shown in FIG. 1 across line 3—3 prior to SAMOS etching.

In the SAMOS (self-aligned MOS) etch process to form stacked-gate non-volatile memory by self-aligned etching as shown in FIGS. 1–3, the stacked gate 18 is patterned using a two-step process. First, the poly-1 layer 11 is defined (i.e., formed by etching) using a poly-1 photolithography process as consisting of a plurality of parallel strips perpendicular to the direction of the control gates (CG) 14 to be eventually formed. After the depositions of an interpoly dielectric layer 12 and the poly-2 layer 13, a SAMOS mask, which coincides with the control gates 14, is defined with a photoresist. Thereafter, the poly-2 layer, 13 the interpoly dielectric layer, 11 and the poly-1 layer 11 are etched, step by step, under the same SAMOS mask so that poly-1 layer is self-aligned to the overlaying poly-2 layer which becomes the floating gates layer. However, since some of the poly-1 layer has been etched during the first poly-1 etching, the portion 17 of the Si substrate between FOX regions 13 will be trenched during the SAMOS etching.

As discussed earlier, one of the solutions to alleviate this problem is to implement a heavy N+ implantation after the poly-1 patterning, followed by a thermal oxidation. This allows the trench region between the poly-1 strips and the field oxide regions to grow a thicker oxide layer as result of the heavy doping enhanced oxidation. By doing so, the buried N+ (BN) oxide causes the Si substrate to be protected from being trenched during the poly-1 removal as part of the SAMOS etching. However, this approach requires an extra thermal cycle. Also, the heavy doping also enhances the oxidation along the poly-1 sidewall, this makes the subsequent SAMOS etching more difficult. Furthermore, this technique also requires a relatively large source diffusion line width, shown as distance "a", to prevent the bird's beak from punching-through, as well as relatively wide spacing between the source diffusion line 16 and the control gate, shown as distance "b", to provide adequate margin for field oxide rounding and misalignment. Both distances cause the cell size to increase.

Figure 4:
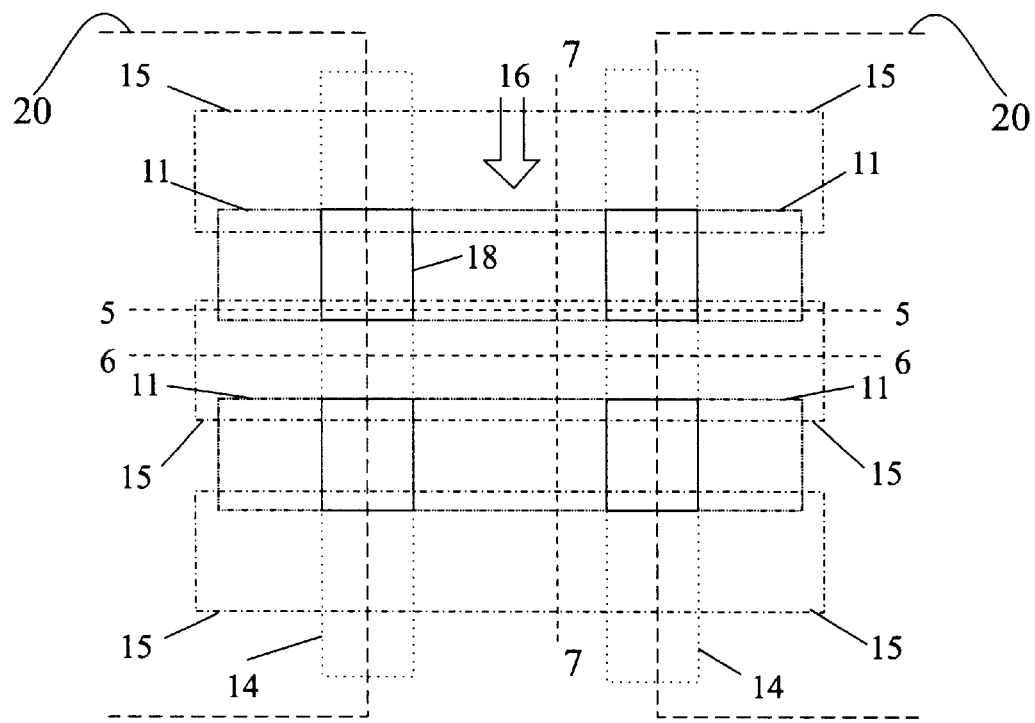
FIG. 4 is an illustrative schematic plan view of a prior art stacked gate memory cell fabricated according to the SAMOS process.
Figure 5:
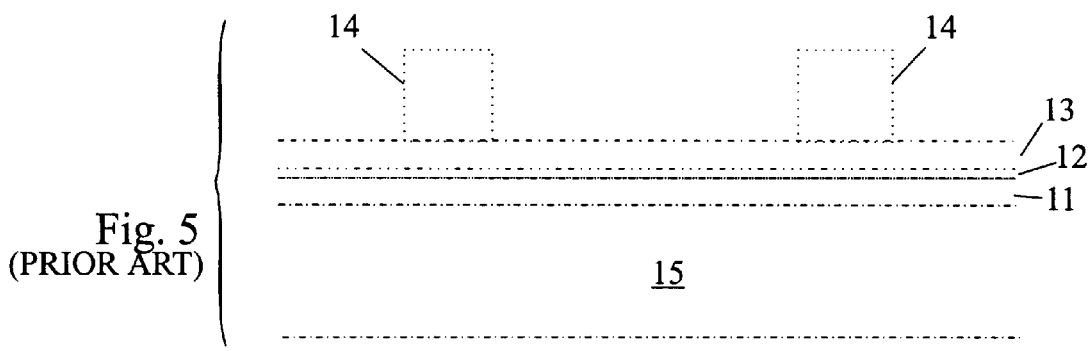
FIG. 5 is an illustrative schematic cross-sectional view of the prior art stacked gate memory cell as shown in FIG. 4 across line 5—5 prior to SAMOS etching.
Figure 6:
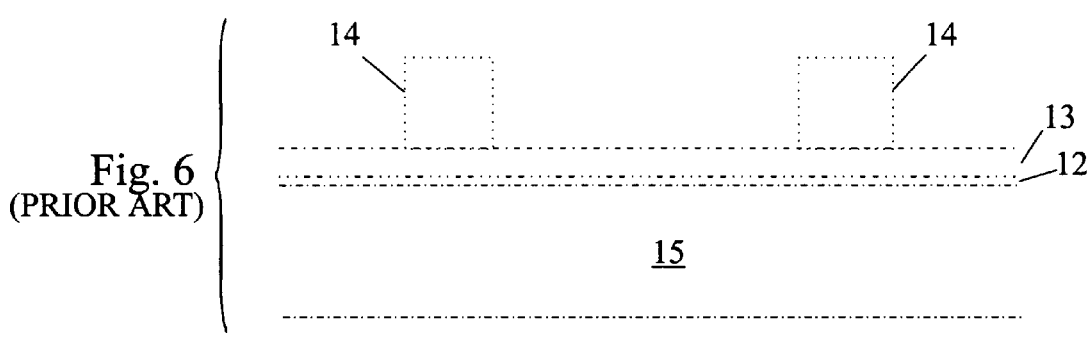
FIG. 6 is an illustrative schematic cross-sectional view of the prior art stacked gate memory cell as shown in FIG. 4 across line 6—6 prior to SAMOS etching.
Figure 7:
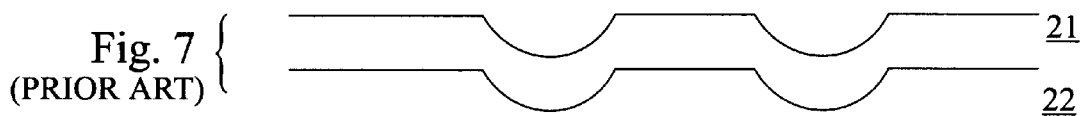
FIG. 7 is an illustrative schematic cross-sectional view of the prior art stacked gate memory cell as shown in FIG. 4 across line 7—7 after SAS etching.

FIG. 4 is an illustrative schematic plan view of a prior art stacked gate memory cell fabricated according to the SAS etch process. FIG. 5 is an illustrative schematic cross-sectional view of the prior art stacked gate memory cell as shown in FIG. 4 across line 5—5 prior to SAMOS etching. FIG. 6 is an illustrative schematic cross-sectional view of the prior art stacked gate memory cell as shown in FIG. 4 across line 6—6 prior to SAMOS etching. And FIG. 7 is an illustrative schematic cross-sectional view of the prior art stacked gate memory cell as shown in FIG. 4 across line 7—7 after SAS etching.

With the SAS process, the field oxide is first formed as parallel strips 11. By doing so, the portion of the field oxide 11 which crosses the source line 16 will protect against substrate trenching during the SAMOS etching. After the SAMOS etching, an SAS etching (i.e., using a SAS mask 20) is implemented to remove the field oxide that crosses the source line 16, followed by the formation of source line connections in the diffusion layer. This approach eliminates the need for a "rule" (finite distance) of source diffusion line to the control gate spacing, thus, allowing the cell size to be reduced somewhat. However, there is also another problem that can be experienced with the SAS approach, in that the source line resistance can be substantially increased due to the significant variations in the device topography. This can cause large drops in the source voltage during cell operations. Furthermore, because the junction depth should be simultaneously scaled down when the cell size is scaled down, this causes the source resistance to increase significantly, especially for the fully-recessed LOCOS isolation. Thus, this approach also restricts the extent by which the isolation can be scaled down. FIG. 7 show the silicon substrate 21 and the source junction 22. Because the injunction depth must be simultaneously scaled when the cell dimension shrinks, this cause the source resistance to increase significantly, especially with the case of fully-recessed LOCOS isolation. Thus the conventional SAS approach also restricts further isolation scaling.

Figure 8:
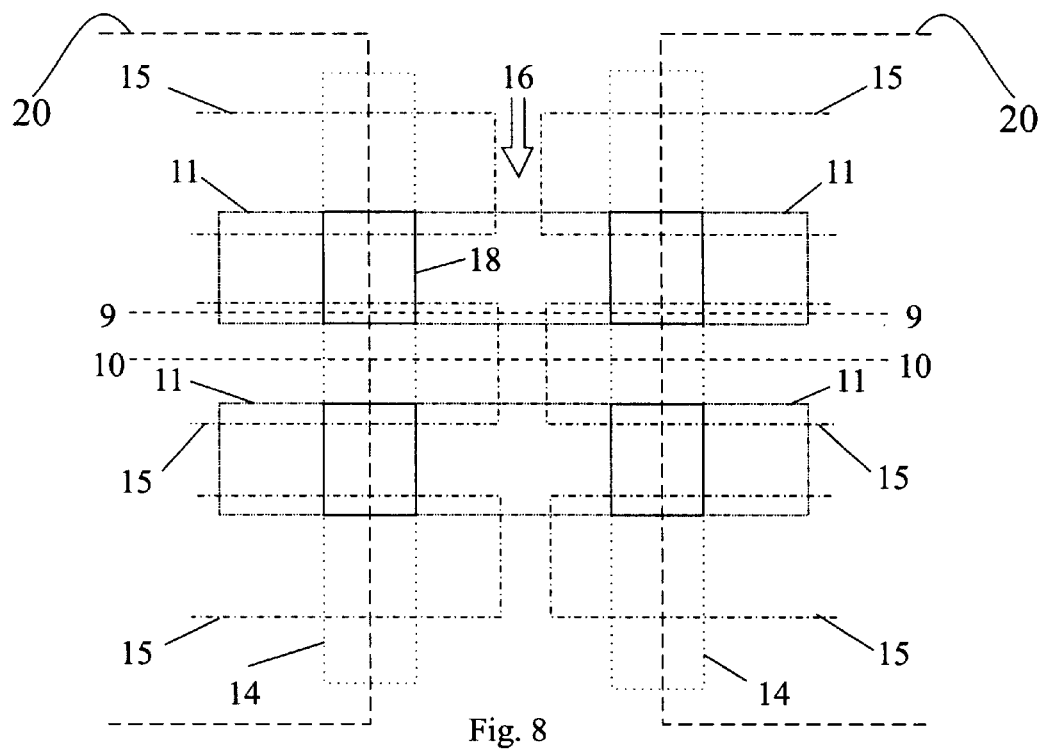
FIG. 8 is an illustrative schematic plan view of the stacked gate memory cell fabricated according to a preferred embodiment of the present invention.
Figure 9:
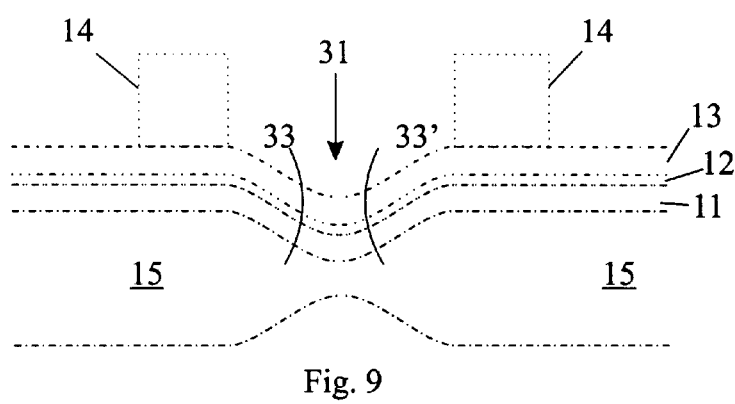
FIG. 9 is an illustrative schematic cross-sectional view of the stacked gate memory cell as shown in FIG. 8 across line 9—9 prior to SAMOS etching.
Figure 10:
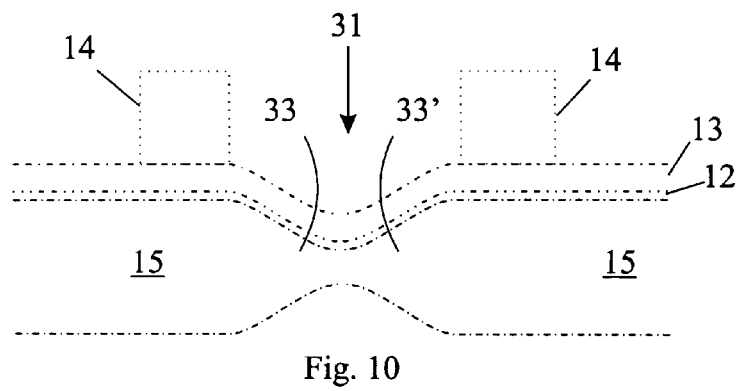
FIG. 10 is an illustrative schematic cross-sectional view of the stacked gate memory cell as shown in FIG. 8 across line 10—10 prior to SAMOS etching.

FIG. 8 is an illustrative schematic plan view of the stacked gate memory cell fabricated according to a preferred embodiment of the present invention. FIG. 9 is an illustrative schematic cross-sectional view of the stacked gate memory cell as shown in FIG. 8 across line 9—9 prior to SAMOS etching. And FIG. 10 is an illustrative schematic cross-sectional view of the stacked gate memory cell as shown in FIG. 8 across line 10—10 prior to SAMOS etching.

The memory cell of the present invention as shown in FIG. 8 is very similar to that shown in FIG. 1 from a conventional SAMOS process. The main difference is that the width of the active area, that is, the space 31 between field oxide regions, or FOX, 32, is intentionally made narrow enough, such that the bird's beaks 33, 33' from neighboring field oxide regions punch through and are connected with each other. All the other steps are very similar to the formation of the self-aligned stacked gate of FIG. 1, including the formation of poly-1 strips, 34, floating gates 35, and SAMOS (which coincide with control gates, CG) 36. The source line 37 shown in FIG. 8 is noticeably narrower than that shown in FIG. 1.

As discussed above, the modified SAMOS of present invention eliminates one extra thermal oxidation cycle from the conventional SAMOS process. Compared to the prior art SAS process, which, as discussed above, utilizes a uniform FOX thickness, because the thickness of the punching bird's beaks is much thinner than that of the field oxide, the source line resistance is much smaller than that by the SAS process. The punching bird's beaks can be removed by the SAS type etching, but no extra mask is needed compared to the conventional SAS process.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

Figure 11:
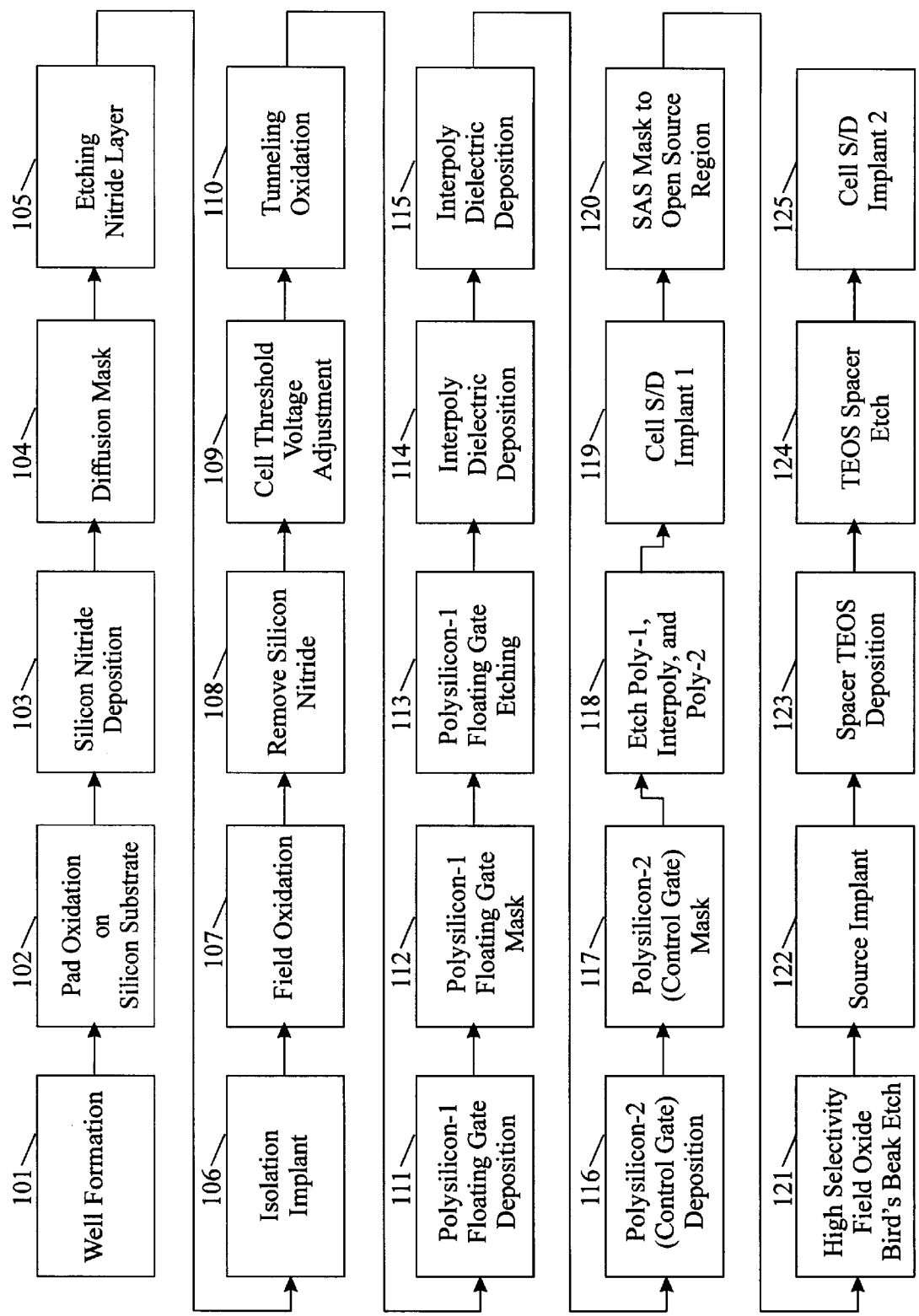
FIG. 11 is a schematic flowchart diagram showing the steps of the process according to a preferred embodiment of the process of the present invention for fabricating self-aligned stacked gate memory cells.

FIG. 11 is a schematic flowchart diagram showing the steps of the process according to a preferred embodiment of the process of the present invention for fabricating self-aligned stacked gate memory cells. These steps are discussed in more detail below:

The process first involves the common step of well formation in a silicon substrate wafer (Step 101). The silicon substrate wafer is oxidized in a furnace to grow a thin layer of (first) silicon dioxide ($SiO_2$) on the surface. This first silicon dioxide layer is known as the "pad" oxide (102). Then silicon nitride is deposited on the oxidized wafer in a gas phase chemical reactor (103). A diffusion pattern mask is then placed on the silicon nitride layer to protect and define the areas where the active regions of the device will be formed (104). The exposed regions of the nitride are etched away, using the diffusion pattern mask, to expose portions of the underlying pad oxide. The exposed pad oxide regions are then also etched away thus exposing the silicon substrate except, again, where the active regions of the device will be formed (105).

The patterned and etched wafer is implanted with additional boron atoms accelerated at high energy. The boron atoms will only reach the silicon substrate where the nitride and oxide has been etched away, providing areas that are doped strongly p-type that will electrically separate active areas (106). After implanting, the wafers are oxidized again to grow a thick oxide layer, which is commonly known as the "field oxide," or FOX. The field oxide only grows in the etched areas due to silicon nitride's properties as an oxidation barrier (107). When the field oxide is grown, some of the silicon substrate is consumed and the silicon nitride is lifted slightly at the edges creating a bird's beak formation. The remaining silicon nitride layer is then removed (108). As it has been discussed above, one of the key elements of the present invention is that the field oxide regions are patterned, i.e., the silicon nitride is etched, such that the bird's beaks from adjacent field oxide will mutually "punch through" and connect with each other, and that the thickness of the "punching through" bird's beak will be greater than the interpoly dielectric layer to be subsequently formed, so as to protect the source line from being trenched during the removal of the portion of the poly-1 layer in the SAMOS etching step.

After the above steps, which allow the active region to be defined and isolated, the threshold voltage of the semiconductor device is adjusted by implanting p-type dopant atoms (109), followed by the growing of the gate tunnel oxide in a high temperature furnace (110). Then the wafer is deposited with a layer of floating gate material (111). This is typically poly crystalline silicon (first polysilicon layer, "poly-1 layer," or floating gate layer) which is deposited in a gas phase chemical reactor similar to that used for silicon nitride (112). A poly-1, or floating gate, mask is then laid on top of the poly-1 layer, which is then etched (113). Next, an interpoly oxide is formed on top of the floating gate layer (114), followed by the deposition of a second polysilicon layer, ("poly-2" layer or control gate layer) (116) with a SAMOS mask pattern laid on top to define the gates of the cell device (117). In this example, another interpoly electric layer is deposited on top of the existing interpoly dielectric layer (115). The second polysilicon layer, then the interpoly oxide, and lastly, the first polysilicon layer are etched (SAMOS etch) in sequence, thus creating the stacked gate formation of a flash memory device (118).

After the stacked gates are formed, the wafer is subjected to a first source/drain implantation, which is typically provided to reduce the unwanted band-band current (119). Thereafter, a SAS mask is placed on top of the device to open the source region (120). Then a high selectivity etching is applied to remove the bird's beak of the field oxide layer (121), followed by source implantation (122). Cell drains are formed by first spacer TEOS deposition (123), followed by TEOS spacer etch (124), and second cell source/drain implantation (125).

Many of the steps described above are well known in the art, thus they will not be described in detail. The key step of the process disclosed in the present invention is that during the formation of the diffusion mask (step 104), the pattern should be defined such that the field oxide regions will contain bird beaks that are mutually punching through (i.e., extending from) two neighboring field oxide regions and are interconnected with each other. The interconnected bird's beaks are thickness such that they provide protection for the substrate in the source line area from trenching during the removal of poly-1 layer as a part of the SAMOS etching process. This feature eliminates the extra thermal oxidation cycle required in the prior art process, while minimizing the source line resistance as well as allowing further scaling down of the memory cell size.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for making stacked gate memory cells comprising the steps of:

(a) forming a silicon nitride layer on a wafer surface above a silicon substrate;

(b) forming a diffusion pattern mask on said silicon nitride layer, said diffusion pattern mask including a source line diffusion mask with a predetermined width;

(c) removing by masked etching a portion of said silicon nitride layer not covered by said diffusion pattern mask to expose a portion of said silicon substrate, followed by removing said diffusion pattern mask;

(d) using a remaining portion of said silicon nitride as a mask to grow a field oxide layer containing a plurality of isolated field oxide regions in said silicon substrate, wherein said source diffusion mask has such a predetermined width that said field oxide layer is formed to contain bird beaks extending from each of said field oxide regions and that bird beaks from neighboring field oxide regions merge with each other to form an interconnected field oxide bird's beak;

(e) forming a poly-1 layer, an interpoly dielectric layer, and a poly-2 layer on said wafer surface, wherein said poly-1 layer is formed as a plurality of poly-1 strips; and (f) forming a SAMOS (self-aligned MOS) mask which contains a plurality of SAMOS strips perpendicular to said poly-1 strips, followed by SAMOS etching to remove portions of said poly-1 layer, said interpoly dielectric layer, and said poly-2 layer not covered by said SAMOS mask and form a plurality of stacked gates;

(e) further wherein said interconnected field oxide bird's beak is formed to be thicker than a thickness of said interpoly dielectric layer so as to protect the portion of said silicon substrate not covered by said poly-1 strips from being trenched during said SAMOS etching process.

2. The method for making stacked gate memory cells according to claim 1 which further comprises the step of forming a pad oxide layer prior to the deposition of said silicon nitride layer.

3. The method for making stacked gate memory cells according to claim 1 which further comprises the steps of forming a SAS (self-aligned source) mask to open a source region, followed by using said SAS mask to selectively etch said interconnected field oxide bird's beaks, and source implant.

4. The method for making stacked gate memory cells according to claim 1 said field oxide layer comprises a plurality of field oxide strips each of said field oxide strips contains a plurality of said field oxide regions connected by said interconnected field oxide bird's beaks.

* * * * *